United States Patent [19]
Pierson

[11] Patent Number: 6,014,934
[45] Date of Patent: Jan. 18, 2000

[54] MODULAR MODEL TRAIN CIRCUIT BOARD ARRANGEMENT

[75] Inventor: Marty Pierson, Howell, Mich.

[73] Assignee: Lionel, LLC, Chesterfield, Mich.

[21] Appl. No.: 09/185,557

[22] Filed: Nov. 4, 1998

[51] Int. Cl.[7] .................................................. B61D 17/00
[52] U.S. Cl. ..................... 105/26.05; 105/1.5; 105/27; 361/683
[58] Field of Search ................... 105/1.5, 26.05, 105/29.2, 157.2, 238.2, 27; 104/295, 296, 300; 446/410; 704/272; 340/635; 361/600, 627, 683, 633, 636, 640, 736, 752, 760, 686

[56] References Cited

U.S. PATENT DOCUMENTS

| | | | |
|---|---|---|---|
| 4,147,939 | 4/1979 | Russell | 340/635 |
| 4,307,302 | 12/1981 | Russell | 340/635 |
| 4,450,772 | 5/1984 | Van Sickle | 104/295 |
| 5,341,453 | 8/1994 | Hill | 104/300 |
| 5,441,223 | 8/1995 | Young et al. | 104/300 |
| 5,761,033 | 6/1998 | Wilhelm | 361/686 |
| 5,816,886 | 10/1998 | Cusolito | 446/410 |
| 5,855,004 | 12/1998 | Novosel et al. | 105/1.5 |
| 5,865,518 | 2/1999 | Jarrett et al. | 361/683 |

*Primary Examiner*—Mark T. Le
*Attorney, Agent, or Firm*—Rader, Fishman & Grauer PLLC

[57] ABSTRACT

A modular circuit board arrangement for use in a model train includes a motherboard mounted on the model train platform. The motherboard has receptacles that accept and communicate signals with a plurality of removable circuit modules for controlling model train operations. These circuit modules may include, for example, a light control circuit module and a sound control circuit module.

27 Claims, 15 Drawing Sheets

MODULAR MODEL TRAIN CIRCUIT BOARD ARRANGEMENT

FIELD OF THE INVENTION

The present invention relates to model railroads. More particularly, the present invention relates to circuit board arrangements for use in model trains.

BACKGROUND

Model train systems have been in existence for many years. During the long history of model train systems, technology has advanced to allow hobbyists to enjoy model trains with ever increasing realism. For instance, sound simulation is one aspect of model train systems that has benefited from significant advances over the years. The earliest model train systems lacked sound simulation capabilities. Later, miniature whistles, bells, and the like were added to imitate sounds that might be generated by a real-world train. Unfortunately, such miniature devices are limited in their ability to produce realistic sounds.

Further developments in model train sound simulation technology led to the use of speakers to play back sounds recorded from real-world trains. Using pre-recorded sounds has improved realism to some degree, but some shortcomings can be detected by even the casual observer. For example, the pre-recorded sounds tend to be looped. Hobbyists who play with the train for a sufficiently long period of time can often notice the repetition of certain sounds. In addition, in many systems using pre-recorded sounds, the sounds to be played back are selected as a function of user inputs, e.g., commands, only. Thus, for example, a horn sounds the same whether the model train is stopped or running at full speed.

Keeping up to date with the latest technology has conventionally required hobbyists to purchase new trains or, at least, new circuit boards, to upgrade their systems. As a result, the expense involved in keeping a model train system up-to-date has been relatively high. These costs have been particularly discouraging to certain beginning hobbyists who do not want to make a large commitment of money to a state of the art system, but do not want a model train system that they will have to replace altogether. Hobbyists who only want to upgrade certain aspects of their model train systems rather than the whole system have also been discouraged by these costs.

SUMMARY OF THE INVENTION

According to one embodiment, the present invention is directed to a model train for use with a model railroad. The model train comprises a model railroad car having a platform. A modular circuit board arrangement includes a motherboard mounted on the platform. The motherboard has a plurality of receptacles configured and arranged to accept and communicate signals with a plurality of removable circuit modules for controlling operations performed by the model train.

Another embodiment of the present invention is directed to a model train for use with a model railroad. The model train includes a model railroad car having a platform. A motherboard is mounted on the platform and comprises a plurality of receptacles configured and arranged to accept and communicate signals with a plurality of removable circuit modules inserted therein. A motor driver arrangement is coupled to the motherboard and is configured and arranged to control a motor of the model train. A light control circuit module, inserted in a first receptacle of the motherboard, is responsive to a radio signal and is configured and arranged to control at least one light device in the model train in response to the radio signal. Inserted in a second receptacle of the motherboard, a sound control circuit module is configured and arranged to detect operating conditions of the model train and to select sound effects to be generated as a function of the detected operating conditions.

Still another embodiment of the present invention is directed to a modular circuit board arrangement for use in a model train. The modular circuit board arrangement comprises a motherboard mounted on a platform of the model train. The motherboard has a plurality of receptacles configured and arranged to accept and communicate signals with a plurality of removable circuit modules for controlling operations performed by the model train. One of these plurality of removable circuit modules is a light control circuit module inserted in a first receptacle of the motherboard. The light control circuit module is responsive to a radio signal and configured and arranged to control at least one light device in the model train in response to the radio signal. Inserted in a second receptacle of the motherboard is a sound control circuit module, which is configured and arranged to detect operating conditions of the model train and to select sound effects to be generated as a function of the detected operating conditions.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

These and other aspects and advantages of the present invention will become apparent upon reading the following detailed description and upon reference to the drawings, in which:

FIGS. 10A–10C, 11A and 11B and 12A–12B are schematic diagrams illustrating a sixth example circuit module for installation in the modular model train circuit board arrangement, according to another embodiment of the present invention.

Figure 1:
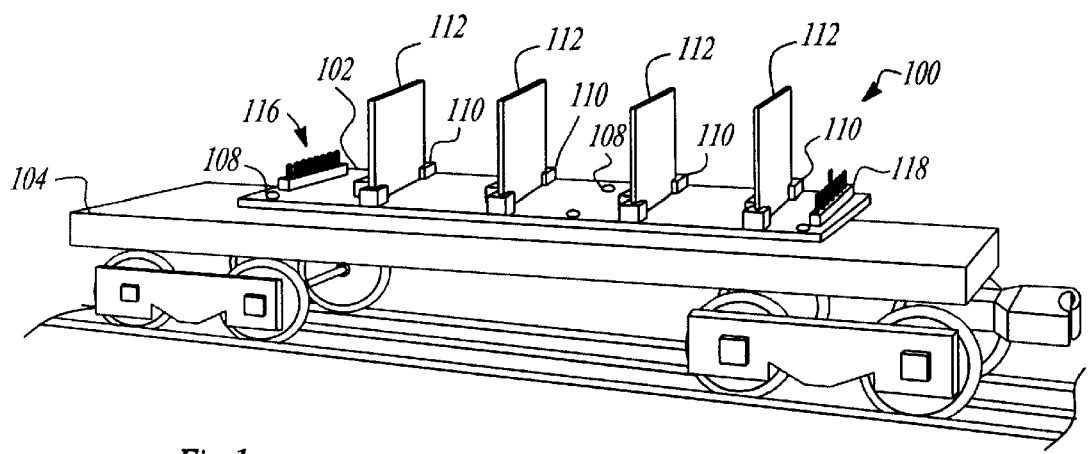
FIGS. 1–3 illustrates an example modular model train circuit board arrangement, according to an embodiment of the present invention.

The invention is amenable to various modifications and alternative forms. Specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of model railroad systems. The invention has been found to be particularly advantageous in applications in which it is desirable to customize the configuration of model railroad features. An appreciation of various aspects of the invention can be gained through a discussion of various application examples operating in such environments.

According to one embodiment of the present invention, a modular circuit board arrangement is used to control a model train. A motherboard serves as a common connection between a number of printed circuit (PC) boards installed on the motherboard, transferring signals among the PC boards and the various other components of the model train.

Figure 2:
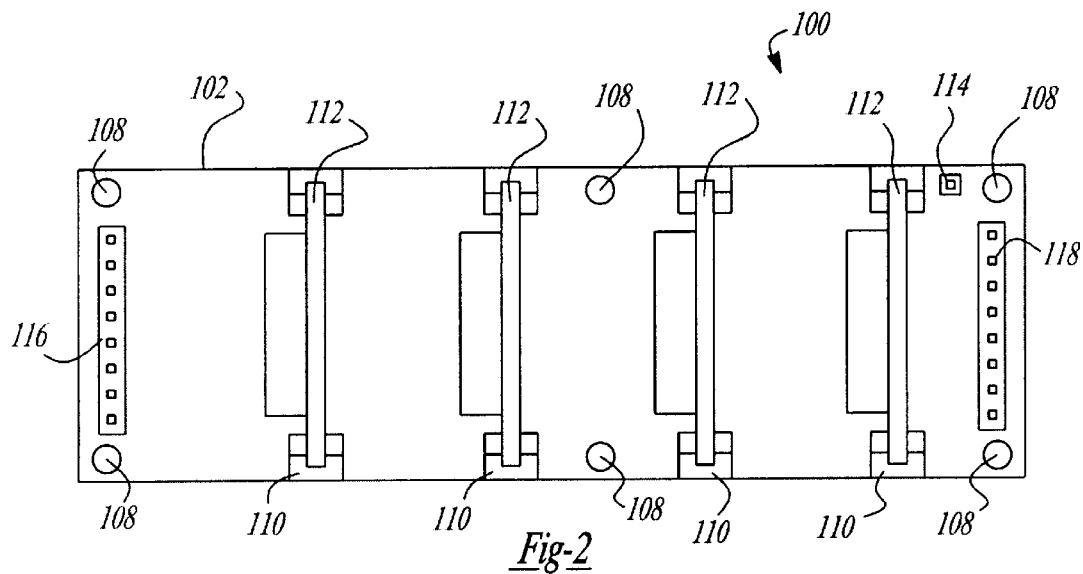
Figure 3:
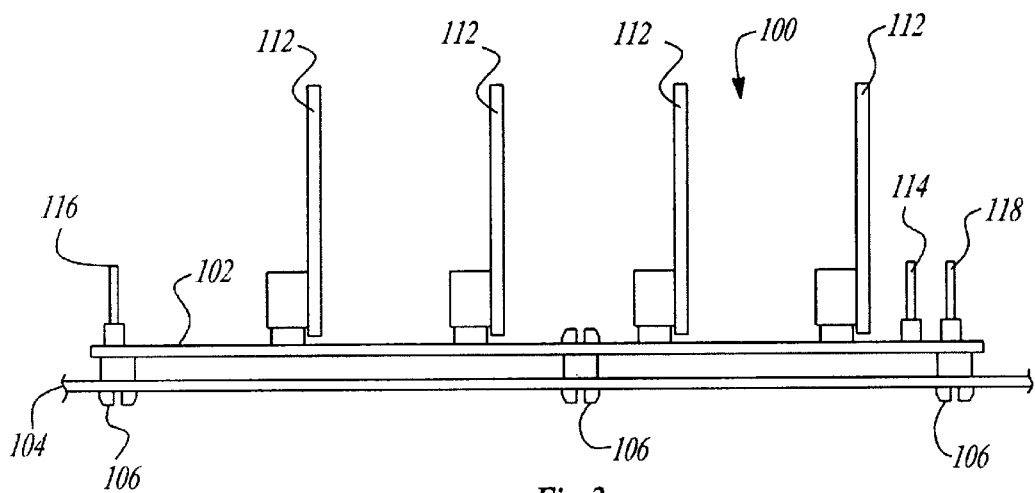

Referring now to the drawings, FIGS. 1–3 illustrate top and side views of an example modular model train circuit board arrangement 100 according to a particular embodiment of the present invention. A motherboard 102 is mounted on a platform 104 of the model train using screws 106 screwed into mounting holes 108. While FIGS. 1–3 illustrate the motherboard 102 having six mounting holes 108, it should be understood that a larger or smaller number can be used. For example, in an alternative embodiment, the motherboard 102 has four mounting holes 108. Regardless of the number of mounting holes 108, the screws 106 and mounting holes 108 are sized to fit each other. In one embodiment of the present invention, the mounting holes 108 are 0.152 inches in diameter.

Slots 110 are spaced apart along the length of the motherboard 102 to receive PC boards 112. These PC boards control various operational aspects of the model train, including, for example, lighting, sound, and locomotion. The hobbyist can customize the configuration of his or her model railroad set by removing one or more PC boards and installing different, perhaps upgraded, versions of the removed PC boards. For example, a beginning hobbyist might purchase an inexpensive model railroad set having basic features. As the hobbyist becomes more involved with model railroads, it may be desirable to upgrade to more sophisticated components with additional functionality. By removing the basic PC boards from the motherboard and replacing them with the more sophisticated boards, the hobbyist can enjoy more features without having to purchase an entire model train.

In one embodiment, the slots 110 are spaced at intervals that allow heat generated by the PC boards 112 to dissipate, such as one inch. Using one-inch intervals achieves a balance between allowing the hobbyist to install a sufficient number of PC boards 112 and avoiding performance degradation due to heat accumulation and electrical interference between adjacent PC boards 112. In the embodiment illustrated in FIGS. 1–3, the motherboard 102 is 4.87 inches long, allowing four PC boards 112 to be installed. It should be noted that the length of the motherboard 102 can vary according to, for example, the length of the model train car in which the motherboard 102 is mounted.

The motherboard 102 also includes a header 114 having a single receptacle for accepting an antenna (not shown). Two additional single row headers 116 and 118 each have between two and ten receptacles for accepting header pins.

Figure 4:
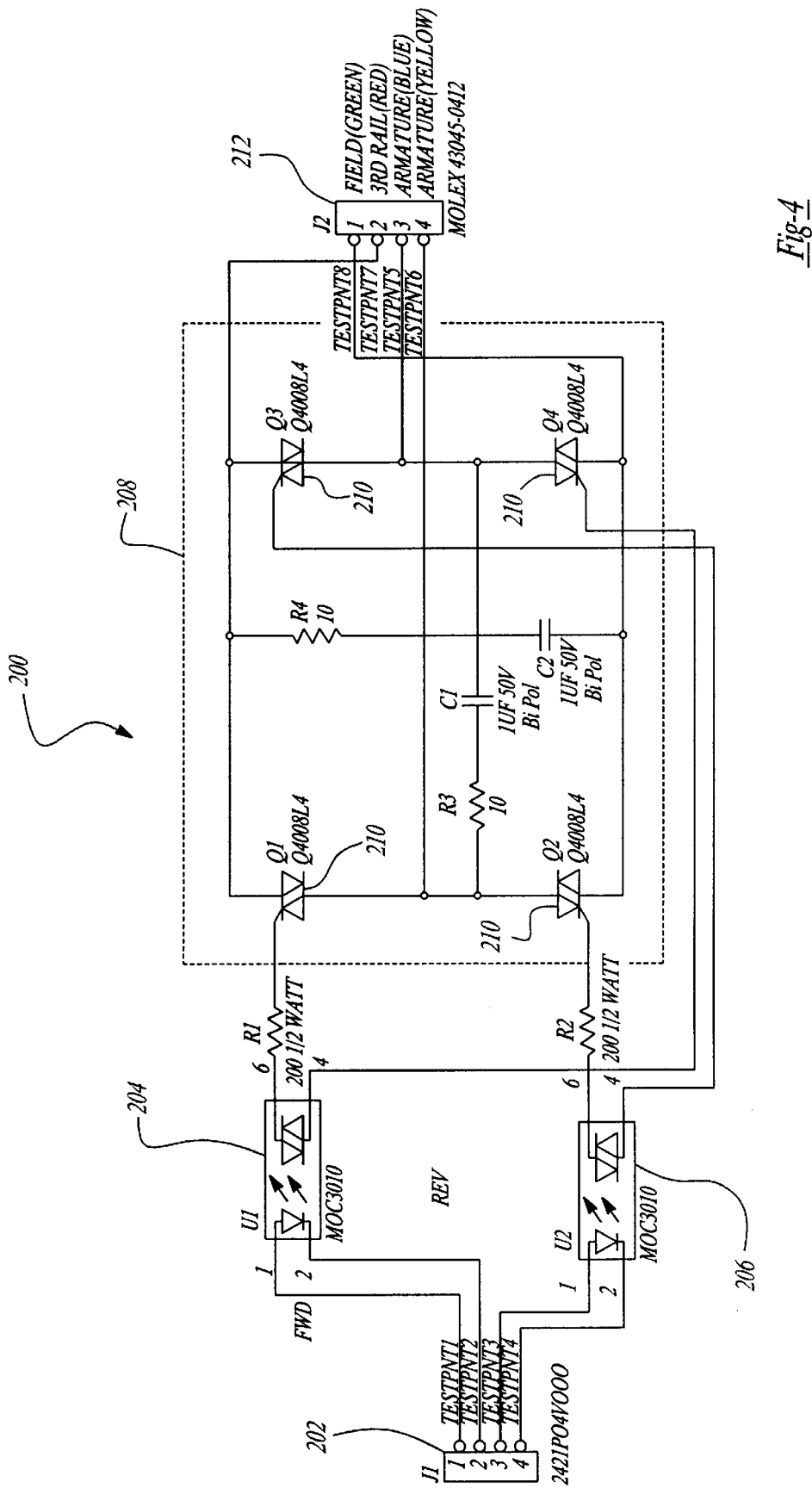
FIG. 4 is a schematic diagram illustrating a first example motor driver circuit for use with the modular model train circuit board arrangement, according to another embodiment of the present invention.
Figure 5:
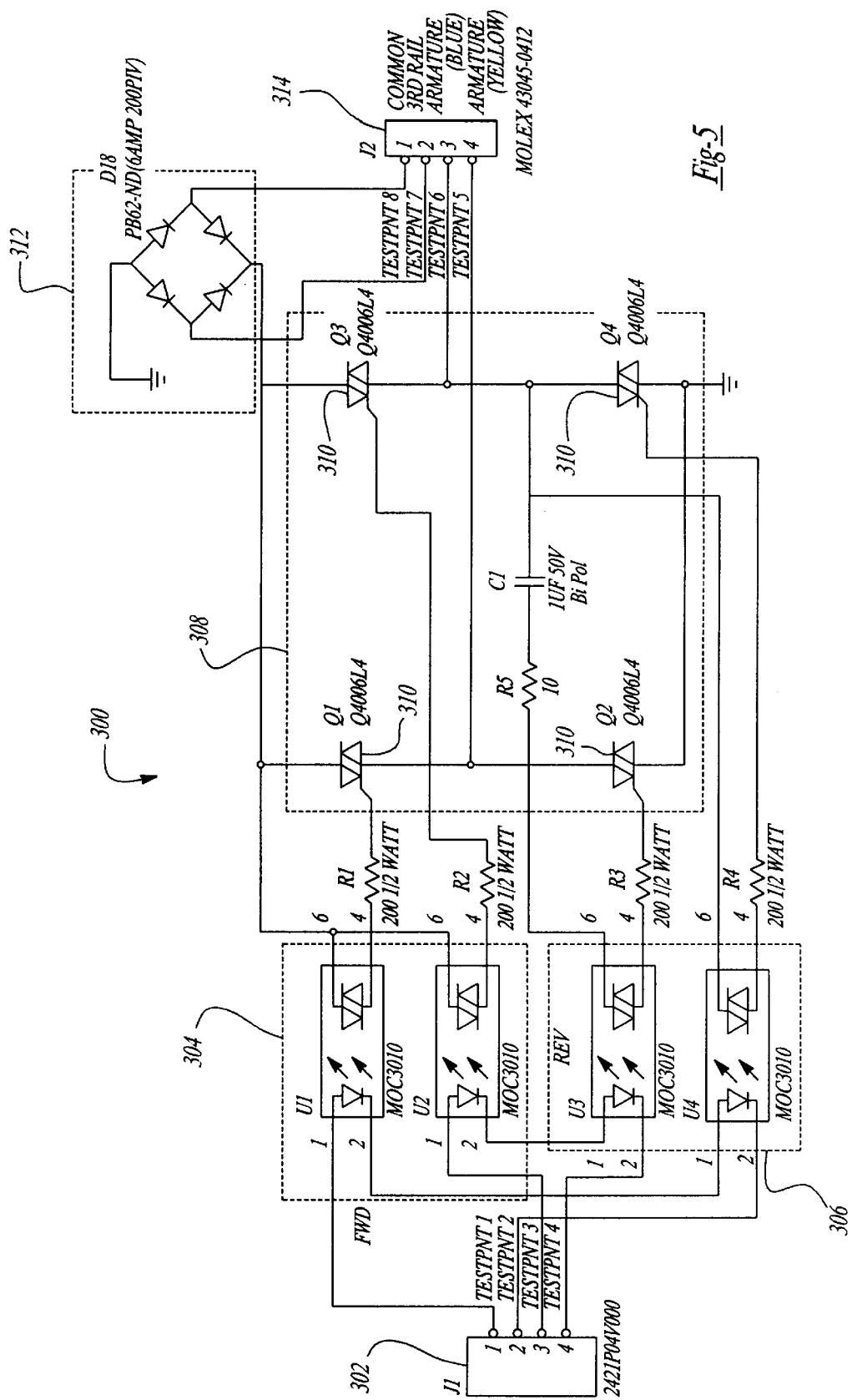
FIG. 5 is a schematic diagram illustrating a second example motor driver circuit for use with the modular model train circuit board arrangement, according to another embodiment of the present invention.

A motor driver arrangement is connected to the motherboard 102 to drive the model train motor. While the motor driver arrangement is preferably connected to the motherboard 102 other than through a slot 110, the motor driver arrangement can be configured to be inserted in a slot 110. FIGS. 4 and 5 illustrate two alternative example motor driver arrangements. It should be noted that only one of the arrangements depicted in FIGS. 4 and 5 is used for a particular model train, depending on the type of motor installed in the train.

FIG. 4 depicts a motor driver arrangement 200 for use with model trains in which an AC motor is installed. The motor driver arrangement 200 depicted in FIG. 4 can deliver a relatively large amount of power, e.g., 8 amperes, to the AC motor. Phase control information is received from the motherboard through an input port 202. This information is used to vary the amount of power supplied to the AC motor. Depending on the particular phase control information received from the motherboard, one of two opto-isolator arrangements 204 and 206 is turned on. If the opto-isolator arrangement 204 is turned on, the motor runs so as to cause the train to move forward. On the other hand, if the opto-isolator arrangement 206 is turned on instead, the train moves in a reverse direction. A horse bridge 208 uses a plurality of triacs 210 to control the phase angle of the power supplied to the motor, thus varying the amount of power and the direction in which the motor runs. Power is then supplied to the motor through an output port 212.

FIG. 5 illustrates a motor driver arrangement 300 for driving a DC motor. Like the arrangement depicted in FIG. 4, the motor driver arrangement 300 is capable of delivering a relatively large amount of power to the motor. An input port 302 receives phase control information from the motherboard for varying the amount of power supplied to the DC motor. Two opto-isolator arrangements 304 and 306 control which direction the train travels. Either the arrangement 304 or the arrangement 306 is turned on, depending on the particular phase control information received from the motherboard. If the opto-isolator arrangement 304 is turned on, the motor runs in one direction so as to drive the train in a forward direction. Turning the opto-isolator arrangement 306 on, by contrast, causes the motor to run in the opposite direction, driving the train in a reverse direction. A horse bridge 308 uses a plurality of triacs 310 to control the phase angle of the power supplied to the motor, thus varying the amount of power and the direction in which the motor runs. The AC power is then rectified to pulsating DC power for output to the motor using a full wave bridge rectifier 312. The pulsating DC power is then provided to the motor through an output port 314.

Figure 6:
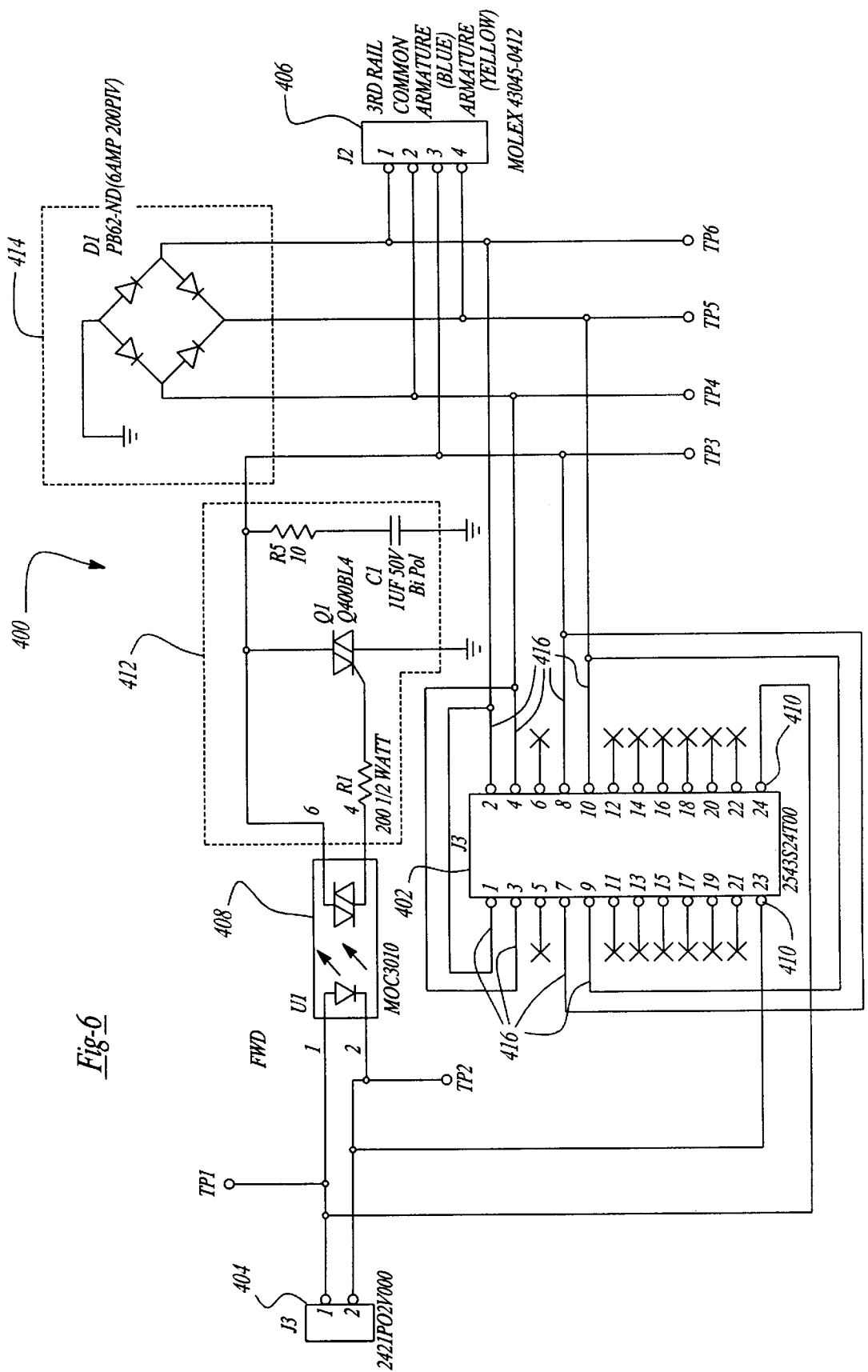
FIG. 6 is a schematic diagram illustrating a third example circuit module for installation in the modular model train circuit board arrangement, according to yet another embodiment of the present invention.

Several types of PC boards, examples of which are depicted in FIGS. 6–9C, are optionally installed in the slots 110. For example, FIG. 6 illustrates an optional DC motor driver arrangement module 400. This module is used to drive a DC motor in a single direction with low power. A motherboard interface 402 allows the module 400 to both receive phase control information and supply power to the motor using the motherboard. Alternately, the DC motor driver arrangement module 400 can be used outside a slot by connecting an input port 404 to the motherboard for receiving the phase control information. If the DC motor driver arrangement module 400 is used outside a slot, power is supplied to the motor through an output port 406.

An opto-isolator arrangement 408 is connected to the motherboard either through the input port 404 or through a set of pins 410 of the motherboard interface 402, depending on whether the module 400 is installed in a slot. The opto-isolator arrangement 408 turns on in response to receiving phase control information from the motherboard. A triac arrangement 412 controls the phase angle of the power and, therefore, the amount of power, supplied to the motor. A full-wave bridge rectifier 414 rectifies the AC power to pulsating DC power, which is provided to the motor using either the output port 406 or a set of pins 416 of the motherboard interface.

Figure 7A:
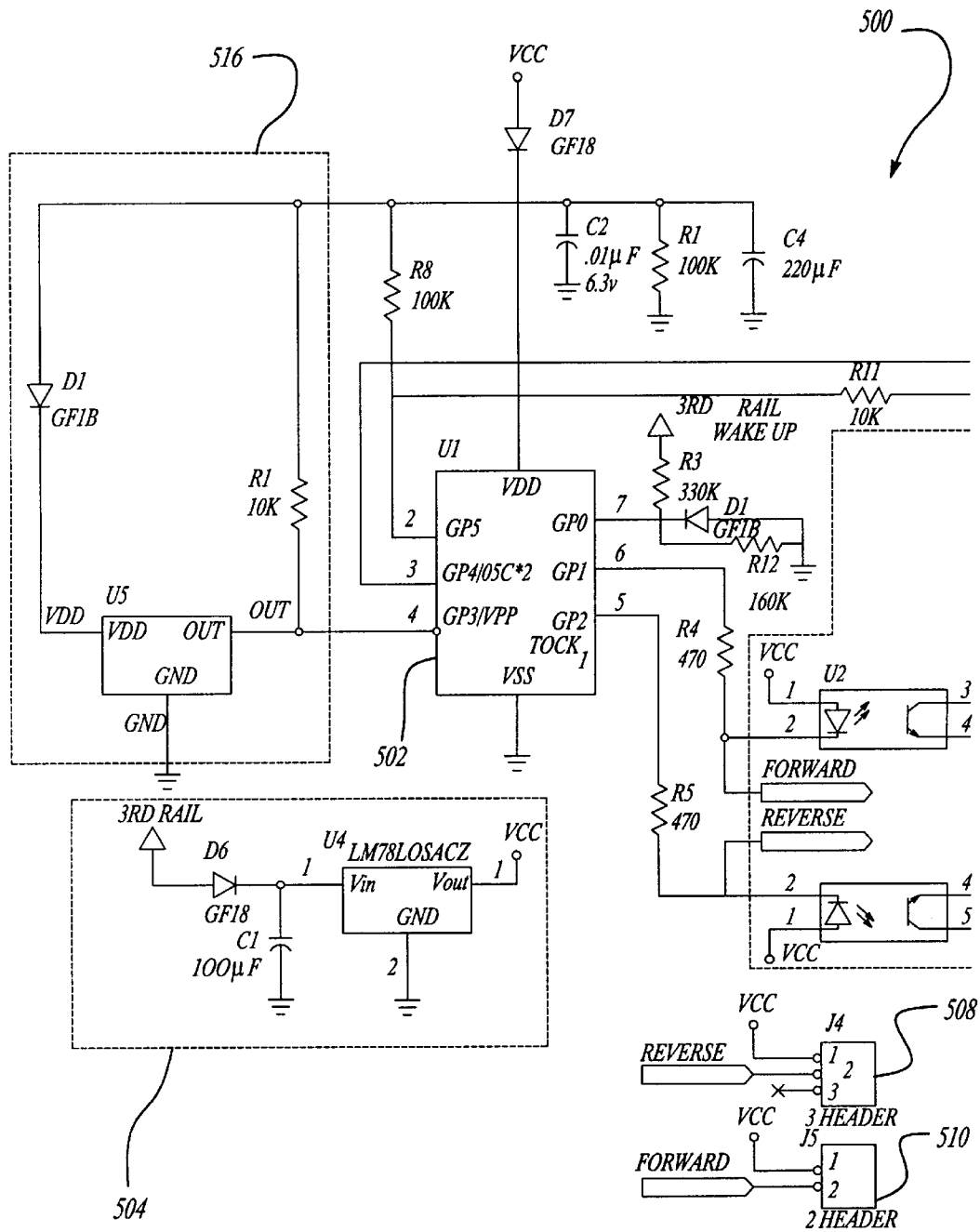
FIGS. 7A–7B are schematic diagrams illustrating a fourth example circuit module for installation in the modular model train circuit board arrangement, according to another embodiment of the present invention.
Figure 7B:
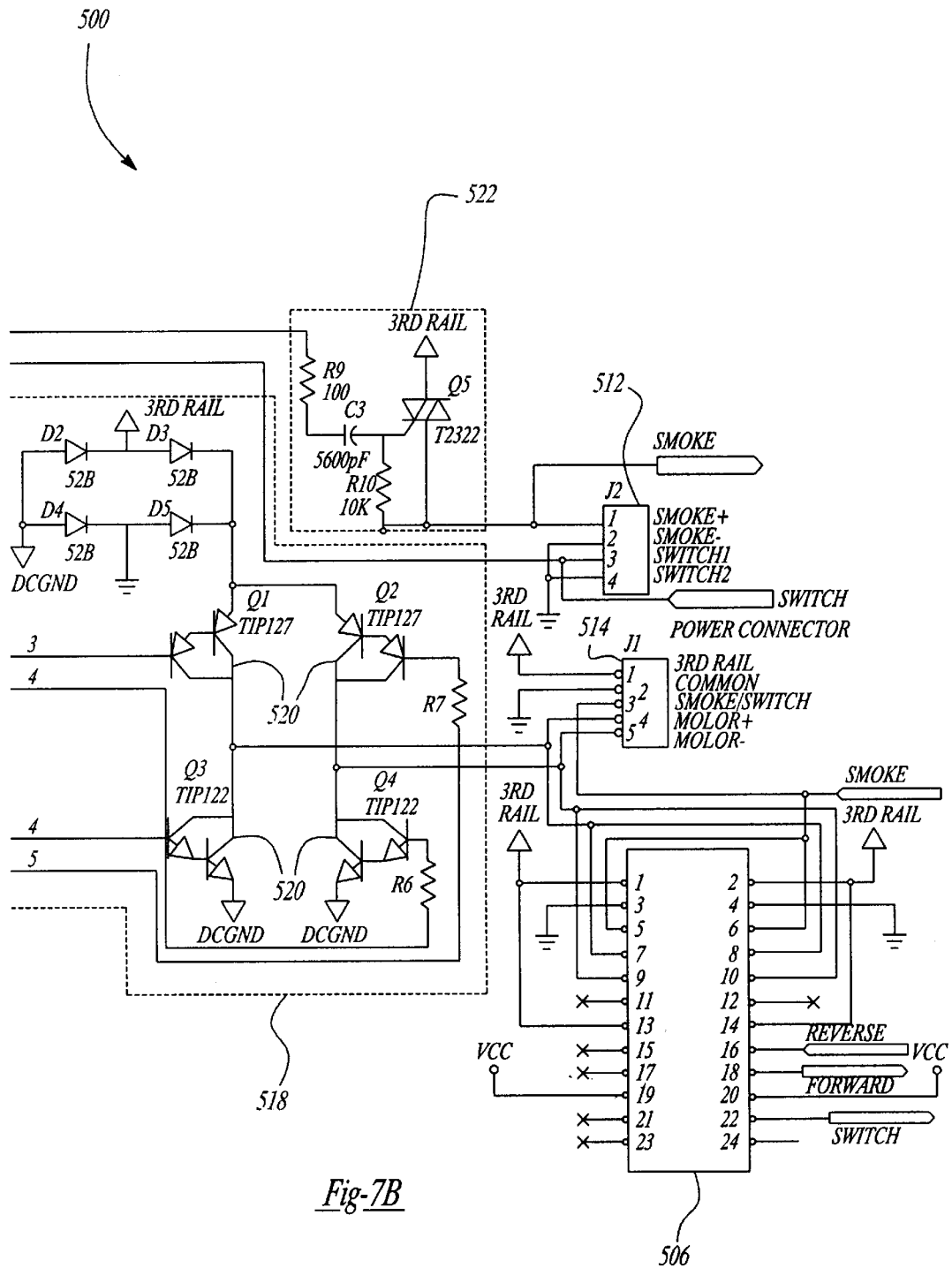

FIGS. 7A–7B illustrates another example type of motor driver arrangement module 500 for use with a DC motor. The motor driver arrangement module 500 uses a microprocessor arrangement 502 to generate the phase control information that, in certain other embodiments of the present information, is received from the motherboard. According to a particular embodiment, the microprocessor arrangement 502 is programmed to operate in one of two user-selectable modes. In one mode, known as command mode, the user controls the operation of the train using commands issued from a remote control unit. In the other mode, known as control mode, train operation is controlled by momentarily interrupting power to switch between forward and reverse operation.

Power is supplied to the motor driver arrangement module 500 using a power arrangement 504. The microprocessor 502 communicates with the motherboard using either a motherboard interface 506 or, if the module 500 is not plugged into a motherboard slot, ports 508, 510, 512, and 514. Using the ports 508 and 510, the user can specify whether the train should run forward or in a reverse direction. Control information for controlling smoke effects is received through the port 512. Power is supplied to the motor through the port 514. The ports 508, 510, 512, and 514 are not used if the module 500 is plugged into a motherboard slot.

A reset circuit 516 is used to reset the microprocessor 502. The microprocessor 502 determines the correct phase control information based on the desired operational mode of the model train and provides this information to a phase-controlled, opto-isolated horse bridge 518. The horse bridge 518 uses bipolar transistors 520 to control the phase angle of the power supplied to the motor, thus varying the amount of power and the direction in which the motor runs. Power is then supplied to the motor through either the port 514 or the motherboard interface 506. The motor driver arrangement module 500 also includes a smoke/light power supply 522, which selectively powers a smoke generator or internal light unit.

Figure 8:
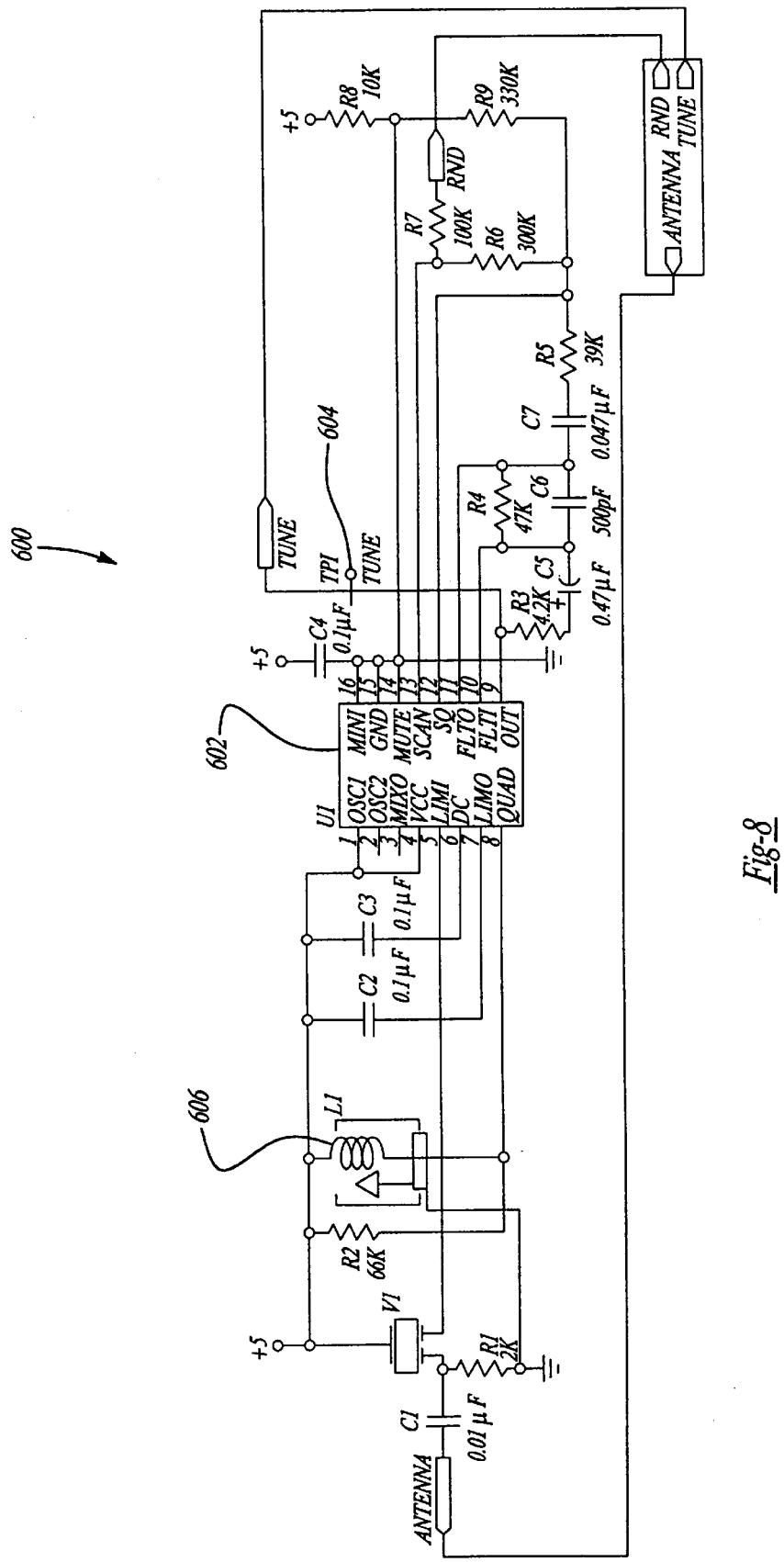
FIGS. 8 and 9A–9B are schematic diagrams illustrating a fifth example circuit module for installation in the modular model train circuit board arrangement, according to another embodiment of the present invention.
Figure 9A:
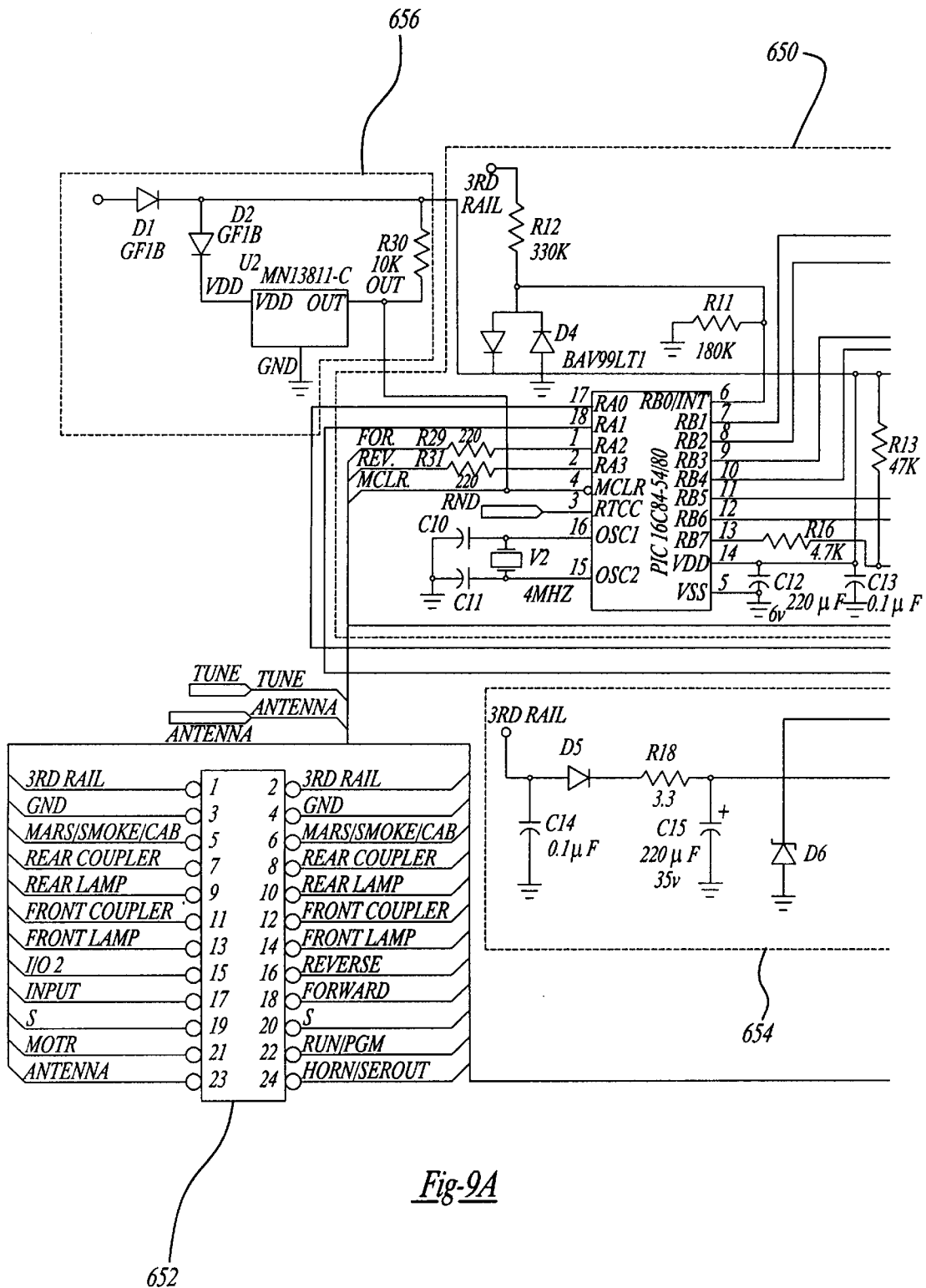
Figure 9B:
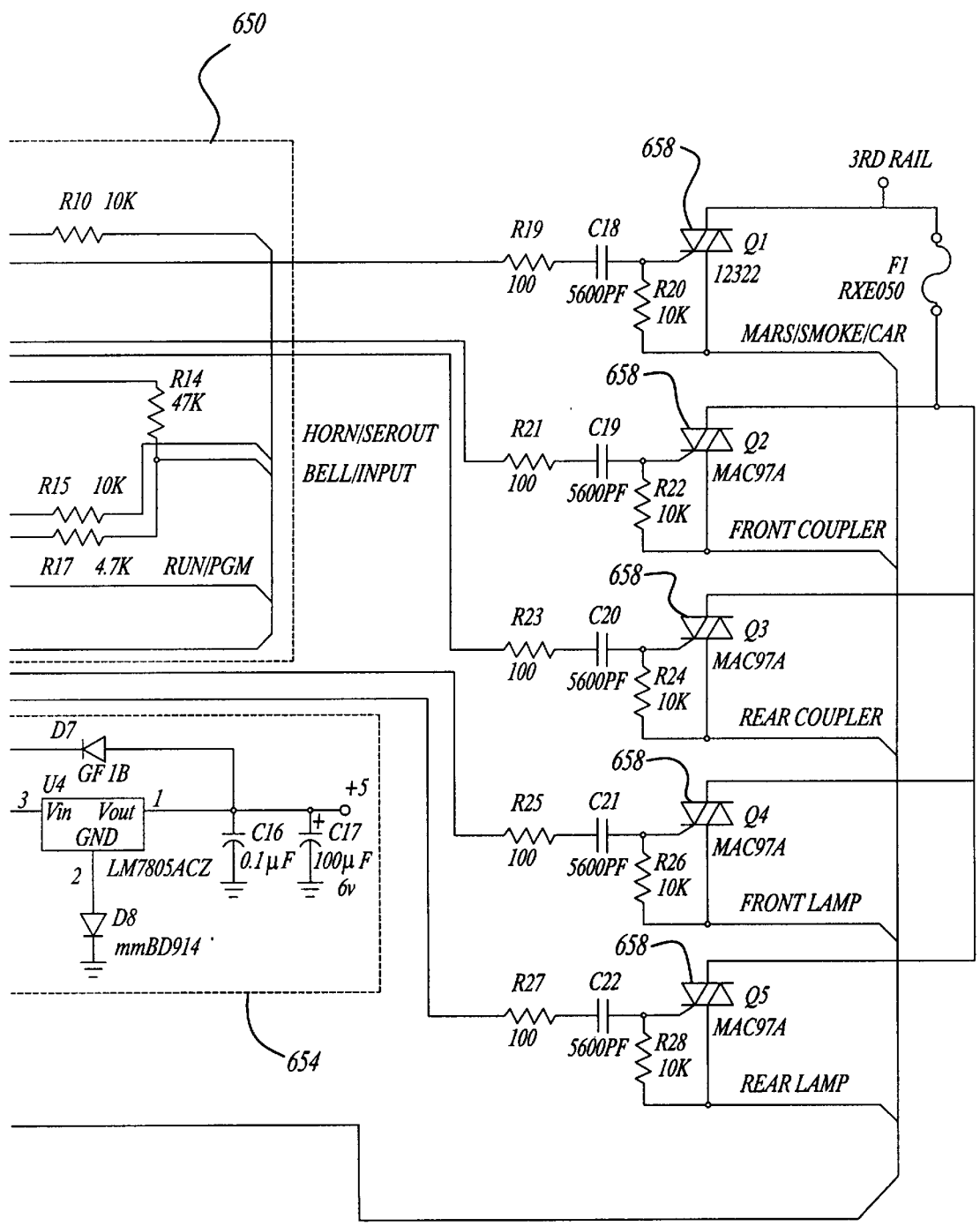

FIGS. 8, 9A and 9B are schematic diagrams illustrating a radio-operated light controller module configured for installation in the motherboard 102 of FIG. 1, according to another particular embodiment of the present invention. A radio receiver arrangement 600 of FIG. 8 receives signals from the model railroad track, which generates an electromagnetic field that varies in response to input signals provided by a remote control unit. A microprocessor 602 tunes the receiver arrangement 600 to receive signals of a particular frequency, varying this frequency using a potentiometer 604 and an adjustable coil 606. Referring now to FIGS. 9A and 9B, a microprocessor arrangement 650 processes the radio signals received from the radio receiver arrangement 600. The microprocessor arrangement 650 is connected to the motherboard 102 through a jumper connection 652. A power supply circuit arrangement 654 supplies power to the microprocessor arrangement 650. A reset controller 656 resets the microprocessor arrangement 650.

The microprocessor arrangement 650 processes the received signals in one of two ways, depending on an operational mode set by a pin RUN/PGM of the jumper connection 652. In a run mode, the microprocessor arrangement 650 recognizes the received signals as instructions to be executed as they are received. By contrast, in a program mode, the microprocessor arrangement 650 treats the signals received from the radio receiver arrangement 600 as programming information, e.g., instructions to be executed in batch-mode fashion. As the microprocessor arrangement 650 executes the instructions, it controls the operation of various lighting effects throughout the model train system through control signals sent to the lighting effects through triacs 658 and the jumper connection 652.

Figure 10A:
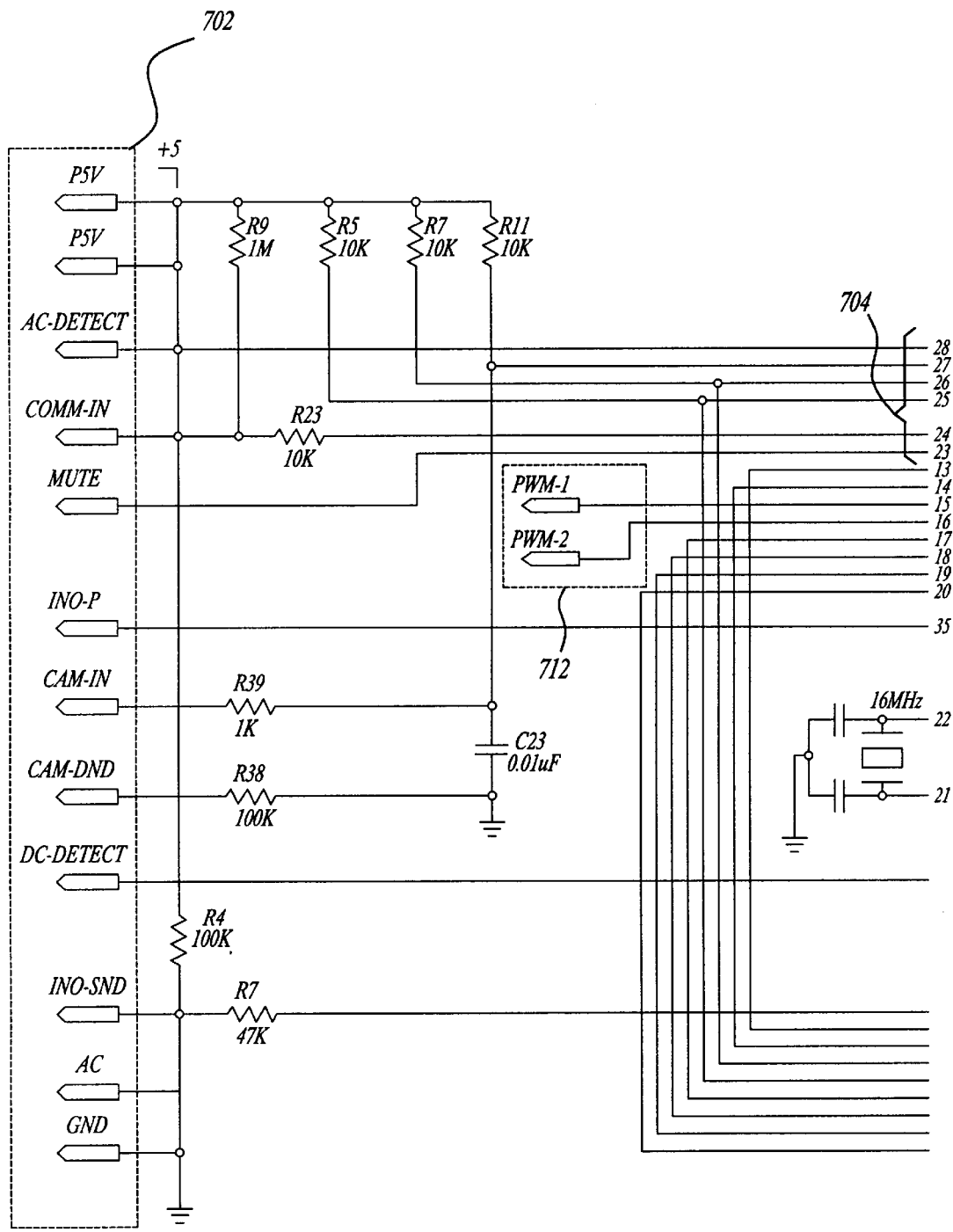
Figure 10B:
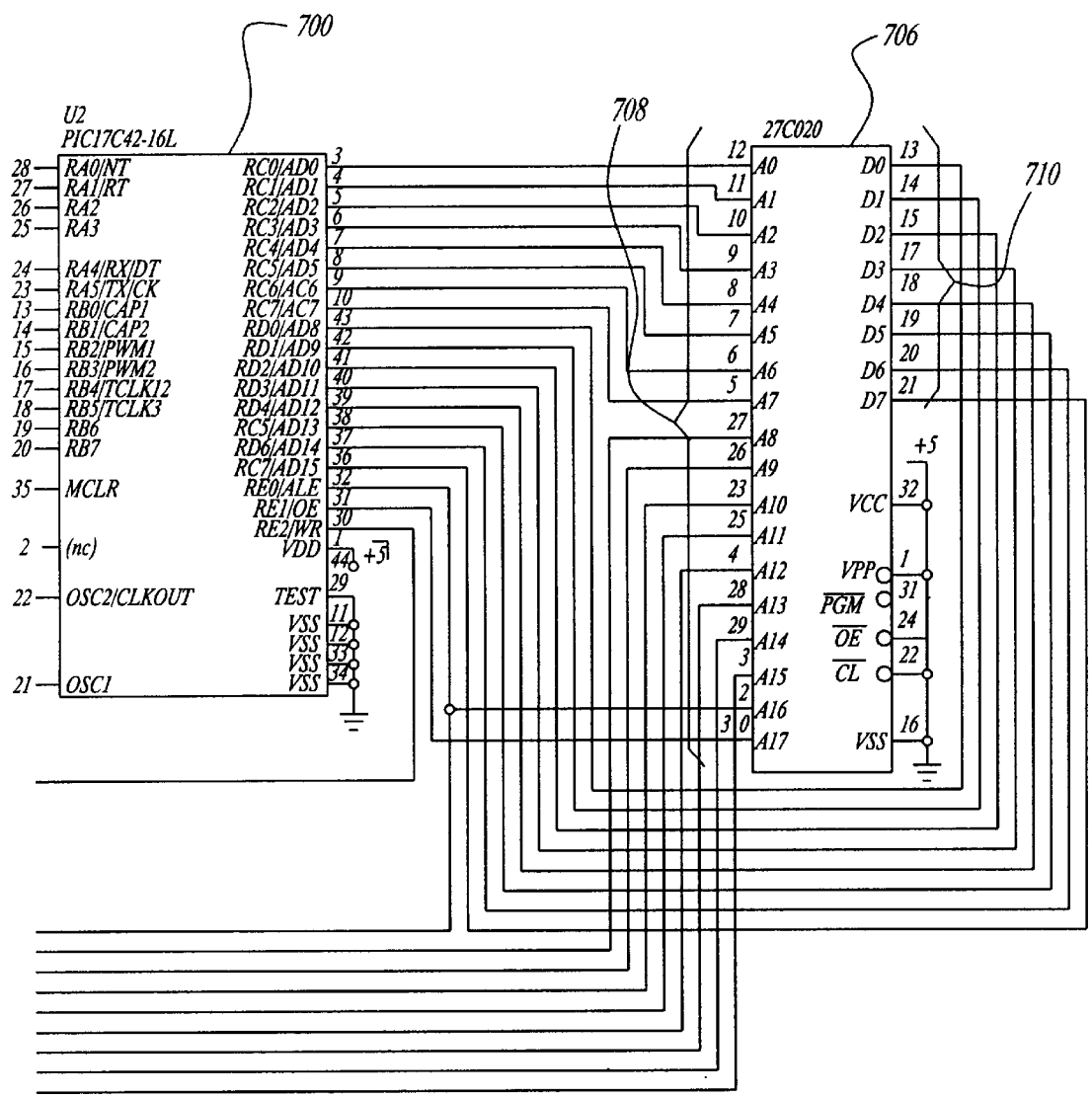

FIGS. 10A–10B, 11A–11B and 12A–12B depict a sound controller circuit module configured for installation in the motherboard 102 of FIGS. 1–3. This sound controller circuit module selects sound effects that are appropriate to the current operating conditions of the model train and causes them to be played. For example, as the model train picks up speed, the sound controller circuit module causes sounds to be played that are consistent with increased speed, such as increasingly loud horns. Referring now to FIGS. 10A–10B, a microprocessor 700 is primarily responsible for determining the conditions that exist in the model train system, such as the motor speed, train speed, power consumption, and other conditions, and selecting an appropriate sound to play. Information relating to these conditions, as well as user control signals and power signals, are supplied to the microprocessor 700 through connections 702. In particular, user control signals for actuating a bell or whistle are superimposed as a DC offset voltage on the track voltage signal and are sensed using an input DC_DETECT, which is received from a DC detection circuit, discussed below in connection with FIG. 9C. A radio controller input COMM_IN is also used to receive control signals from the remote control. The microprocessor 700 detects the amount of power applied to the model train motor using an input AC_DETECT provided by an AC detection circuit, discussed below in connection with FIG. 9C. Train speed information is received from the wheels of the model train on jumper connections CAM_IN and CAM_GND.

Input signals relating to model train conditions are provided to the microprocessor 700 at inputs 704. Based on these inputs, the microprocessor 700 selects one or more sounds or sound segments to be played. For example, a horn sound might be composed of several segments, including a beginning section, one or more middle sections of potentially varying length, and an ending section. In this example, a memory 706 stores these sound segments. The user can activate the horn sound by actuating the appropriate control. Depending on the speed of the model train and possibly other factors, the microprocessor 700 accesses certain locations in the memory 706 corresponding to appropriate beginning, middle, and ending sections. To access the locations within the memory 706, the microprocessor 700 specifies the locations using address lines 708 and reads data that the memory 706 outputs on data lines 710. Based on this data, the microprocessor 700 generates pulse code modulation (PCM) signals PWM1 and PWM2 on outputs 712. It should be understood that the memory 706 can be configured to store different sounds, either instead of or in addition to the horn sounds described above. For example, according to one embodiment of the present invention, the memory 706 stores recorded speech segments for simulating announcements that might be made by the conductor of a train.

Figure 11A:
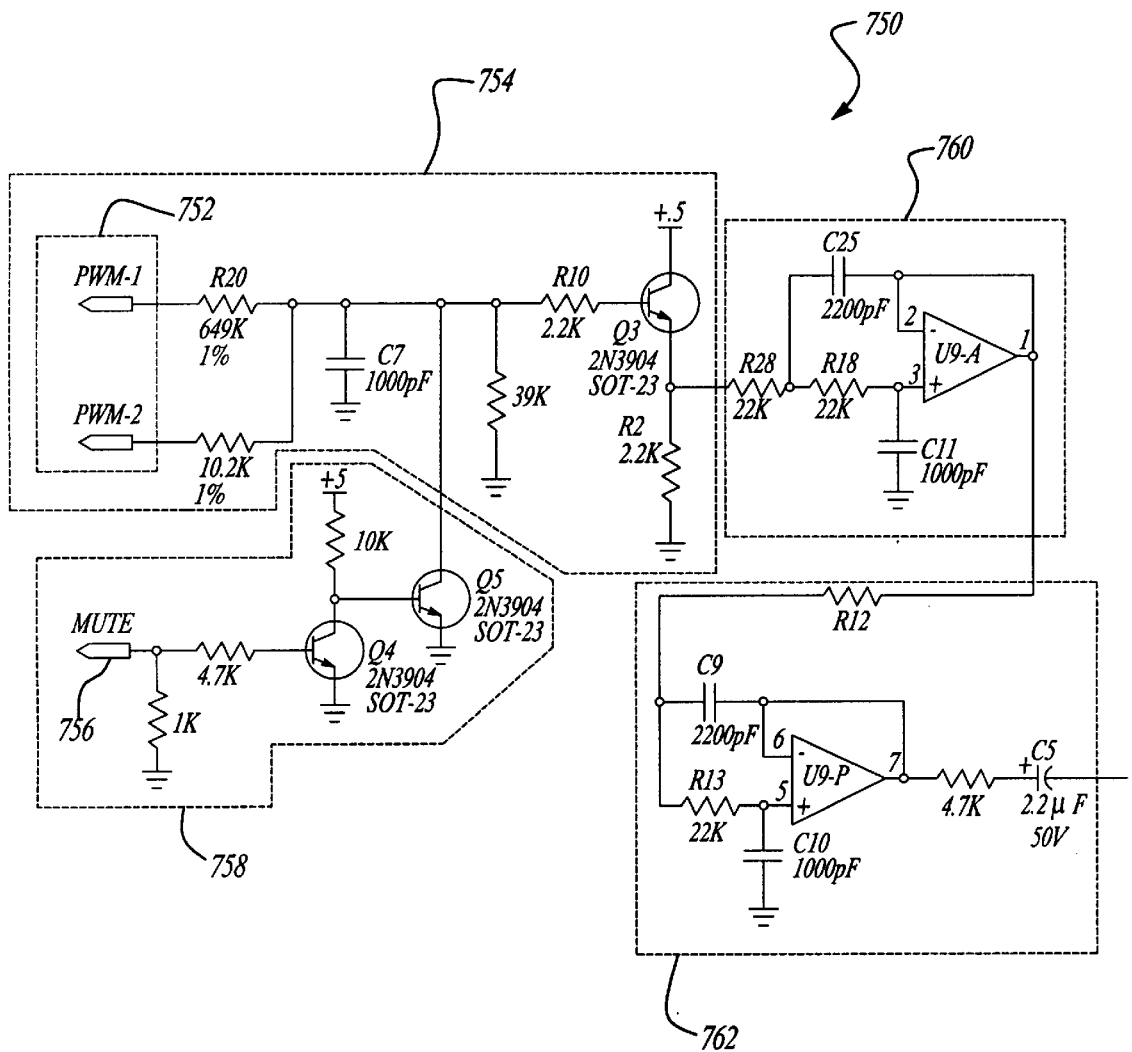
Figure 11B:
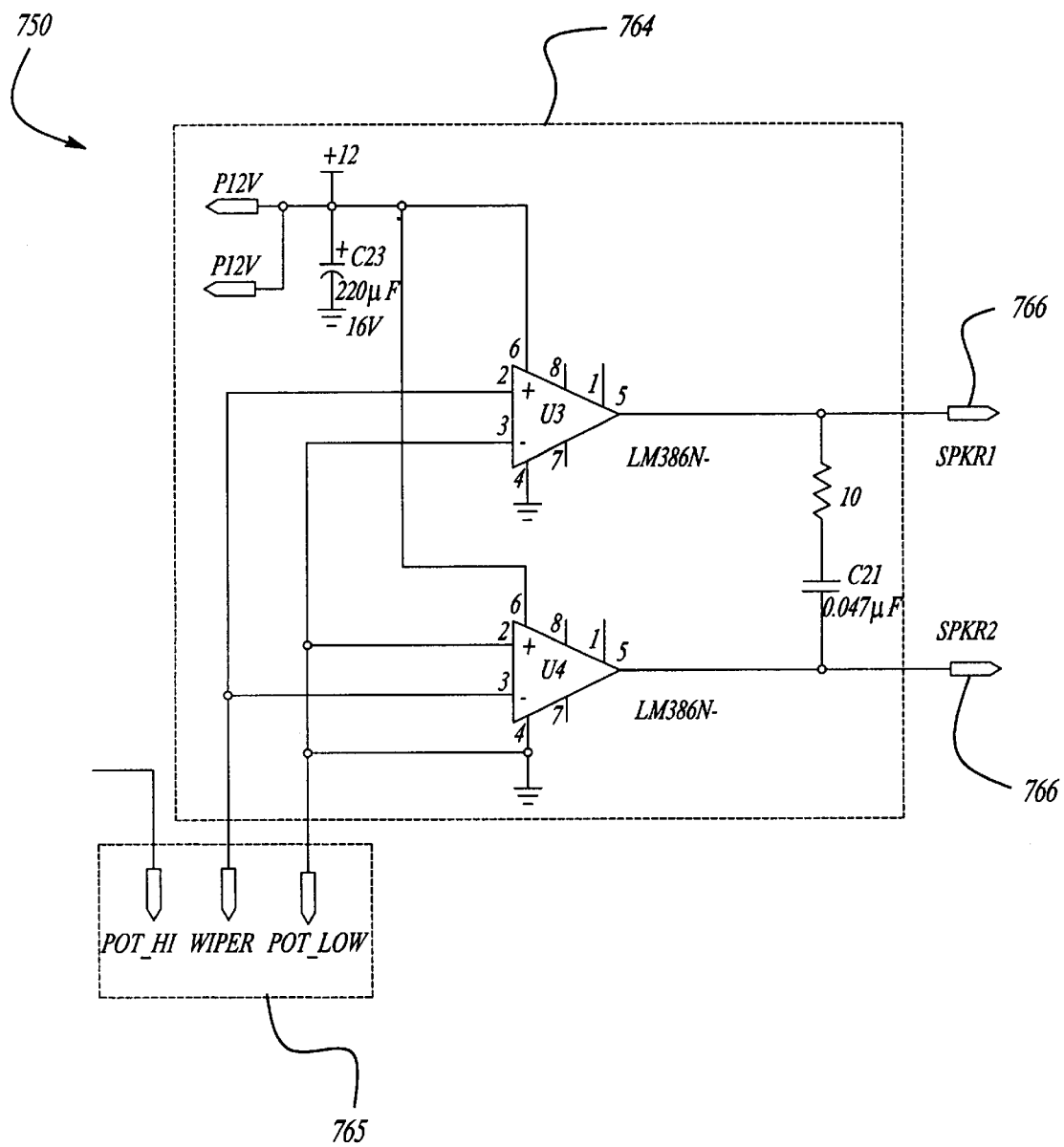

Referring now to FIGS. 11A–11B, the PCM signals PWM1 and PWM2 are provided to a speaker driver circuit arrangement 750 at inputs 752. A summing circuit arrangement 754 sums the PCM signals PWM1 and PWM2. When asserted by the microprocessor 700, a mute signal MUTE at an input 756 activates a mute circuit arrangement 758. The mute circuit arrangement 758 prevents the speakers from producing sound, thus enabling the user to enjoy his or her model train system at times when silence is desirable, such as during evening hours.

Filters 760 and 762 filter noise from the summed PCM signal. The filtered signal is then amplified using a power amplifier circuit arrangement 764. Potentiometer connections 765 enable the user to control the speaker volume. The power amplifier circuit arrangement 764 outputs differential drive speaker signals SPKR1 and SPKR2, which are provided to the speaker at outputs 766.

Figure 12A:
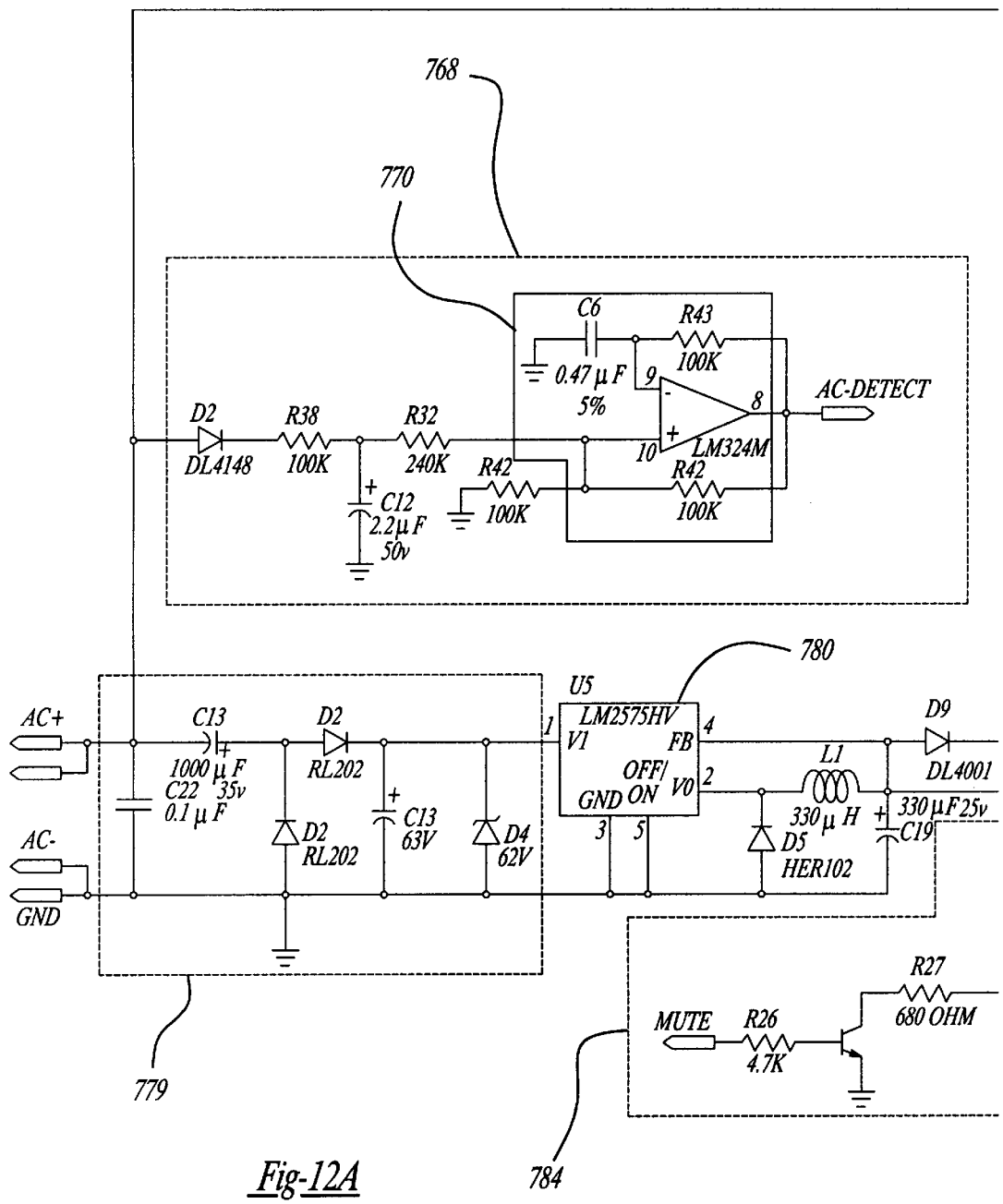
Figure 12B:
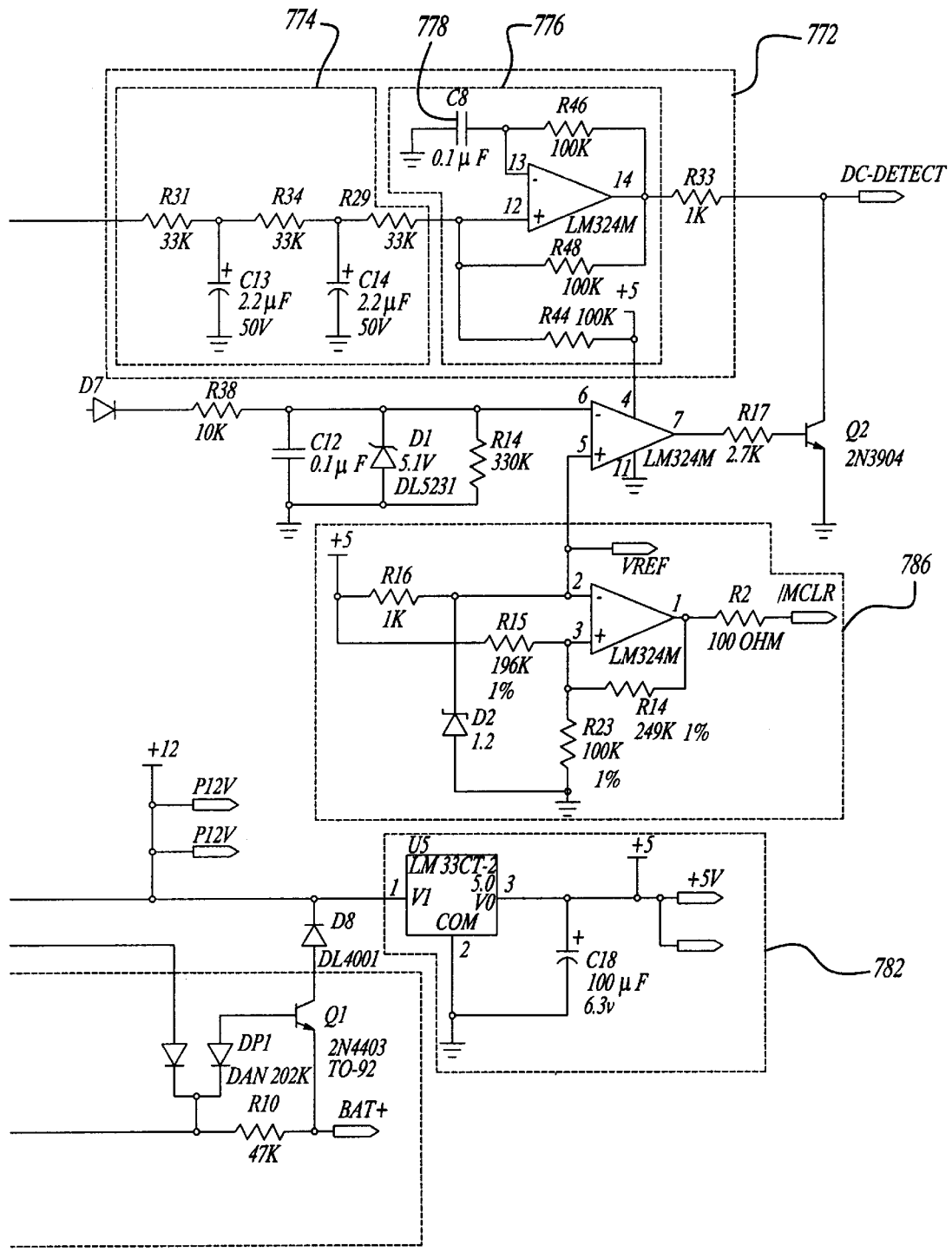

Turning now to FIGS. 12A–12B, the sound controller circuit module receives a track voltage from the model train track at inputs AC+ and AC−. An AC detection circuit 768 detects the AC component of the track voltage by rectifying the track voltage, thereby converting it to a DC voltage. The rectified voltage is input to the noninverting input of an astable multivibrator 770, which varies the frequency of its duty cycle as a function of the AC track voltage. The output of the astable multivibrator 770 is provided to the microprocessor 700 of FIGS. 10A–10B as a signal AC_DETECT. According to one implementation, the AC detection circuit 768 is configured to detect AC voltages ranging from 5 VAC to 21 VAC.

A DC detection circuit 772 detects a DC offset on the track voltage that acts as a bell or whistle actuation signal. A low pass filter 774 filters out the high frequency component of the track voltage and supplies the filtered signal to the noninverting input of an operational amplifier arrangement 776 acting as a comparator. A capacitor 778 on the inverting input of the operational amplifier arrangement 776 is alternately charged and discharged, causing the DC bias on the noninverting input to vary in both frequency and duty cycle as a function of the DC offset. The output of the operational amplifier arrangement 776 is provided to the microprocessor 700 of FIGS. 10A–10B as a signal DC_DETECT. The microprocessor 700 then uses an algorithm to ascertain the DC offset given the frequency and duty cycle of the DC_DETECT signal. When the DC offset exceeds a preselected threshold, e.g., 0.5 V, the microprocessor 700 determines that the user has activated the bell or whistle control and responds accordingly.

The sound controller circuit module is powered by the track voltage received from the model train tracks at the inputs AC+ and AC−. This track voltage is doubled by a voltage doubler 779 and provided to the sound controller circuit module as a 12 V power signal through a switching power supply 780. A power supply arrangement 782 further modifies the signal for input as a 5 V power signal. In the event that the track voltage signal is interrupted, e.g., if the model train loses contact with the track, a battery circuit 784 supplies an alternative power source to the sound controller circuit module from a battery (not shown). A reset circuit 786 resets the sound controller circuit module.

The various embodiments described above are provided by way of illustration only and should not be construed to limit the invention. Those skilled in the art will readily recognize various modifications and changes that can be made to these embodiments without strictly following the example embodiments and applications illustrated and described herein, and without departing from the true spirit and scope of the present invention, which is set forth in the following claims.

What is claimed is:

1. For use with a model railroad, a model train comprising:
   a model railroad car having a platform; and
   a modular circuit board arrangement comprising a motherboard, mounted on the platform and having a plurality of receptacles configured and arranged to accept and communicate signals with a plurality of removable circuit modules capable of controlling a plurality of different operations performed by the model train.

2. A model train, according to claim 1, wherein the receptacles are arranged in a spaced-apart configuration for facilitating dissipation of heat generated by the removable circuit modules.

3. A model train, according to claim 2, wherein the receptacles are spaced apart by one inch.

4. A model train, according to claim 1, wherein the motherboard further comprises a second receptacle configured and arranged to accept an antenna.

5. A model train, according to claim 1, wherein the motherboard further comprises a plurality of row headers, each comprising a plurality of receptacles configured and arranged to accept header pins.

6. A model train, according to claim 1, further comprising a motor driver arrangement, coupled to the motherboard and configured and arranged to control a motor of the model train.

7. A model train, according to claim 6, wherein the motor driver arrangement comprises a removable circuit module configured for insertion in one of the receptacles of the motherboard.

8. A model train, according to claim 7, wherein the motor driver arrangement is configured and arranged to control an AC motor.

9. A model train, according to claim 8, wherein the motor driver arrangement is configured and arranged to receive phase control information from the motherboard and to vary an amount of power supplied to the AC motor as a function of the phase control information.

10. A model train, according to claim 7, wherein the motor driver arrangement is configured and arranged to control a DC motor.

11. A model train, according to claim 10, wherein the motor driver arrangement is configured and arranged to receive phase control information from the motherboard and to vary an amount of power supplied to the DC motor as a function of the phase control information.

12. A model train, according to claim 11, wherein the motor driver arrangement is coupled to the motherboard through an input port to receive the phase control information and is further coupled to the motherboard through an output port to supply the power to the DC motor.

13. A model train, according to claim 1, wherein one of the plurality of removable circuit boards is a DC motor driver circuit arrangement inserted in one of the plurality of receptacles of the motherboard.

14. A model train, according to claim 13, wherein the DC motor driver circuit arrangement is configured to receive phase control information from the receptacle in which it is inserted and to supply power to a motor through the receptacle in which it is inserted.

15. A model train, according to claim 13, wherein the DC motor driver circuit arrangement comprises a microprocessor arrangement, configured to generate phase control information for varying the amount of power supplied to a motor.

16. A model train, according to claim 15, wherein the microprocessor arrangement is configured to operate in any of a plurality of user-selectable modes.

17. A model train, according to claim 16, wherein, in a first user-selectable mode, the microprocessor arrangement is configured to control operation of the model train in response to commands issued by a remote control unit, and, in a second user-selectable mode, the microprocessor arrangement is configured to change the direction of motion of the model train by interrupting the power supply to the motor.

18. A model train, according to claim 13, wherein the DC motor driver circuit arrangement further comprises means for controlling at least one of a smoke generator and an internal light unit.

19. A model train, according to claim 1, wherein one of the plurality of removable circuit boards is a light control circuit module responsive to a radio signal.

20. A model train, according to claim 19, wherein the light control circuit module comprises:

a radio receiver arrangement, configured to receive a radio signal generated by the model railroad; and a microprocessor arrangement, responsive to the radio receiver arrangement and configured and arranged to control at least one light device in the model train in response to the radio signal.

21. A model train, according to claim 1, wherein one of the plurality of removable circuit boards is a sound control circuit module configured and arranged to detect operating conditions of the model train and to select sound effects to be generated as a function of the detected operating conditions.

22. A model train, according to claim 21, wherein the sound control circuit module is configured and arranged to select the sound effects as a function of at least one of a speed of the model train and an amount of power applied to a motor of the model train.

23. A model train, according to claim 21, wherein the sound control circuit module is configured and arranged to select at least one of a bell sound effect and a whistle sound effect to be generated in response to a DC offset voltage superimposed on a voltage signal generated by the model railroad.

24. For use with a model railroad, a model train comprising:

a model railroad car having a platform;

a motherboard, mounted on the platform, the motherboard comprising a plurality of receptacles configured and arranged to accept and communicate signals with a plurality of removable circuit modules inserted therein;

a motor driver arrangement, coupled to the motherboard and configured and arranged to control a motor of the model train;

a light control circuit module, inserted in a first receptacle of the motherboard, responsive to a radio signal, and configured and arranged to control at least one light device in the model train in response to the radio signal; and a sound control circuit module, inserted in a second receptacle of the motherboard, configured and arranged to detect operating conditions of the model train and to select sound effects to be generated as a function of the detected operating conditions.

25. For use in a model train, a modular circuit board arrangement comprising:

a motherboard mounted on a platform of the model train and having a plurality of receptacles configured and arranged to accept and communicate signals with a plurality of removable circuit modules for controlling operations performed by the model train, one of the plurality of removable circuit modules comprising a light control circuit module, inserted in a first receptacle of the motherboard, responsive to a radio signal, and configured and arranged to control at least one light device in the model train in response to the radio signal, another of the plurality of removable circuit modules comprising a sound control circuit module, inserted in a second receptacle of the motherboard, configured and arranged to detect operating conditions of the model train and to select sound effects to be generated as a function of the detected operating conditions.

26. For use with a model railroad, a model train comprising:

a model railroad car having a platform;

a modular circuit board arrangement comprising a motherboard, mounted on the platform and having a plurality of receptacles configured and arranged to accept and communicate signals with a plurality of removable circuit modules for controlling operations performed by the model train; and a motor driver arrangement, coupled to the motherboard and configured and arranged to control a motor of the model train.

27. For use with a model railroad, a model train comprising:

a model railroad car having a platform;

a modular circuit board arrangement comprising a motherboard, mounted on the platform and having a plurality of receptacles configured and arranged to accept and communicate signals with a plurality of removable circuit modules for controlling operations performed by the model train; and wherein one of said plurality of removable circuit modules is a DC motor driver circuit arrangement inserted in one of the plurality of receptacles of the motherboard.

* * * * *